(12) United States Patent
Vannier

(10) Patent No.: US 8,765,604 B2
(45) Date of Patent: Jul. 1, 2014

(54) INTERCONNECTION STRUCTURE FOR AN INTEGRATED CIRCUIT

(75) Inventor: Patrick Vannier, Le Versoud (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 115 days.

(21) Appl. No.: 13/327,462

(22) Filed: Dec. 15, 2011

(65) Prior Publication Data

US 2012/0153490 A1 Jun. 21, 2012

(30) Foreign Application Priority Data

Dec. 17, 2010 (FR) ..................... 10 04932

(51) Int. Cl.
*H01L 21/44* (2006.01)
*H01L 21/4763* (2006.01)

(52) U.S. Cl.
USPC ........... 438/666; 438/640; 438/638; 438/637; 438/629; 438/627

(58) Field of Classification Search
USPC ......... 438/622, 627, 629, 637, 638, 640, 666; 257/773, 774
See application file for complete search history.

(56) References Cited

U.S. PATENT DOCUMENTS

| 6,051,508 | A | * | 4/2000 | Takase et al. ................. 438/724 |
| 6,590,290 | B1 | * | 7/2003 | Cronin et al. ................. 257/774 |
| 2003/0013296 | A1 | | 1/2003 | Apelgren et al. |
| 2003/0040188 | A1 | * | 2/2003 | Hsu et al. ..................... 438/697 |
| 2008/0128907 | A1 | | 6/2008 | Yang et al. |
| 2008/0254600 | A1 | * | 10/2008 | Liu et al. ...................... 438/494 |
| 2008/0277797 | A1 | | 11/2008 | Yu et al. |
| 2009/0206491 | A1 | | 8/2009 | Wada et al. |

FOREIGN PATENT DOCUMENTS

| DE | 102006037722 A1 | 3/2007 |
| GB | 2330001 A | 4/1999 |

* cited by examiner

*Primary Examiner* — Fernando Toledo
*Assistant Examiner* — Karen Kusumakar
(74) *Attorney, Agent, or Firm* — Seed IP Law Group PLLC

(57) ABSTRACT

The disclosure relates to a method of fabricating an interconnection structure of an integrated circuit, comprising the steps of: forming a first conductive element within a first dielectric layer; depositing a first etch stop layer above the first conductive element and the first dielectric layer; forming an opening in the first etch stop layer above the first conductive element, to form a first connection area; depositing a second dielectric layer above the etch stop layer and above the first conductive element in the connection area; etching the second dielectric layer to form at least one hole which is at least partially aligned with the connection area; and filling the hole with a conductive material to form a second conductive element in electrical contact with the first conductive element.

9 Claims, 6 Drawing Sheets

INTERCONNECTION STRUCTURE FOR AN INTEGRATED CIRCUIT

BACKGROUND

1. Technical Field

The present disclosure relates to a method of fabricating an integrated circuit comprising an interconnection structure, and to an integrated circuit fabricated by this method.

2. Description of the Related Art

Interconnection structures comprise conductive lines and conductive vias connecting the conductive lines and traversing a dielectric material. Aluminum or copper are conventionally used to form conductive lines and vias. Copper is increasingly replacing aluminum due to its better resistance to electromigration and higher conductivity, allowing for smaller conductive lines and vias and lower power consumption.

FIGS. 1A to 1C are cross-sectional views of an integrated circuit showing different steps of fabricating a conventional interconnection structure I1. In FIG. 1A the interconnection structure I1 comprises, from bottom to top, a base L0, an etch stop layer S0, a first dielectric layer D1, an etch stop layer S1, a second dielectric layer D2, and a mask layer M2.

The integrated circuit also comprises a conductive line F1 (shown in lateral cross-section) and a conductive line F1' (shown in longitudinal cross-section) made of a first conductive material C1, embedded in the dielectric layer D1, and surrounded on the bottoms and sides by diffusion barriers B1, B1'. At the step shown in FIG. 1A, two patterned openings P2, P2' have been made in the mask layer M2. The patterned openings P2, P2' have a misalignment error E1 (shown from center of desired location to center of actual location) with respect to lines F1, F1', such as due to photolithographic limitations.

During steps shown in FIG. 1B, two holes H2, H2' are made in the dielectric layer D2, through the openings P2, P2' of the mask M2. Typically, the dielectric material D2 is first etched (shown as arrows) using a first chemical reagent until the etch stop layer S1 is reached, then a second chemical reagent is used to etch the etch stop layer S1 to reach the underlying conductive lines F1, F1'. An "overetch" step is often performed to ensure that no residue remains on the top surfaces of the conductive lines. Due to the misalignment error E1, the underlying dielectric layer D1 to the side of the conductive line F1 is also etched while the conductive lines are being overetched, causing a lateral etch region E2 in the dielectric material.

During steps shown in FIG. 1C, diffusion barriers B2, B2' are deposited on the sidewalls and bottoms of holes H2, H2'. Due to the deep depth and small size of the lateral etch region E2, a thin or non-existent diffusion barrier B2" is deposited on the walls of the lateral etch region E2. The barriers B2, B2', B2" are then generally covered with a "seed layer" of a conductive material (not shown), and then the holes H2, H2' are filled with a conductive material C2 to form conductive vias F2, F2' in electrical contact with lines F1, F1' at contacts N1, N1'. Barrier B2" may further cause a poor adherence of the "seed layer" in the lateral etch region E2, which leads to a poor-filling of the conductive material C2 in the lateral etch region E2, creating a void E3. Furthermore, barrier B2" allows conductive material to diffuse from via F2 into the dielectric material D1, such that line-to-line leakage may occur, causing a time-dependent dielectric breakdown (TDDB) test failure.

In addition, a critical distance CD between lines F1, F1' is not met due to the lateral etch region E2. As a result, an electrical field between lines F1, F1' may increase, also with an increased possibility of breakdown. Additionally, contact N1 between line F1 and via F2 is smaller than desired, causing higher local current density, which may lead to an increased rate of electromigration and an earlier formation of another void, such that line F1 will no longer be connected to via F2.

It may be desired therefore to provide an alternate method for manufacturing an integrated circuit comprising an interconnection structure.

BRIEF SUMMARY

Embodiments of the disclosure relate to a method of fabricating an interconnection structure of an integrated circuit, comprising the steps of: forming a first conductive element within a first dielectric layer; depositing a first etch stop layer above the first conductive element and the first dielectric layer; forming an opening in the first etch stop layer above the first conductive element, to form a first connection area; depositing a second dielectric layer above the etch stop layer and above the first conductive element in the connection area; etching the second dielectric layer to form at least one hole which is at least partially aligned with the connection area; and filling the hole with a conductive material to form a second conductive element in electrical contact with the first conductive element.

According to one embodiment, the method further comprises the steps of: depositing a second etch stop layer above the first etch stop layer and above the first conductive element in the connection area; depositing the second dielectric layer above the second etch stop layer; and etching the second etch stop layer at the bottom of the hole formed in the second dielectric layer.

According to one embodiment, the method further comprises, after forming an opening in the first etch stop layer above the first conductive element, the step of forming a conductive interface over the first conductive element.

According to one embodiment, the conductive interface is formed by selective deposition.

According to one embodiment, the method further comprises, after forming an opening in the first etch stop layer above the first conductive element, the step of forming a recess in the first conductive element.

According to one embodiment, the method further comprises the step of forming diffusion barriers around the first and second conductive elements.

According to one embodiment, the first and second etch stop layers are chosen from the group consisting of silicon nitride, silicon carbide, silicon carboxide, and silicon carbonide; the diffusion barriers are chosen from the group consisting of titanium, titanium nitride, tantalum, and tungsten nitride; the conductive interfaces are chosen from the group consisting of cobalt tungsten boron and cobalt; the first and second conductive materials are chosen from the group consisting of aluminum, aluminum alloys, copper, copper alloys, tantalum, tungsten, and titanium; and the first and second dielectric materials are chosen from the group consisting of silicon oxycarbide, silicon dioxide, a low-k dielectric, organo-silicate glass, and polyarene ether.

Embodiments of the disclosure also relate to an integrated circuit, comprising: a first conductive element embedded within a first dielectric layer; a first etch stop layer extending above the first conductive element and the first dielectric layer, the first etch stop layer comprising an opening in a connection area; and a second conductive element embedded in a second dielectric layer above the first etch stop layer, the second conductive element in electrical contact with the first conductive element in a first region of the connection area and in horizontal contact with the first etch stop layer in a region outside the connection area.

According to one embodiment, the integrated circuit further comprises a second etch stop layer extending above the first etch stop layer outside the connection area, and extending above the first conductive element in a second region of the connection area, the second dielectric layer being formed above the second etch stop layer.

According to one embodiment, the integrated circuit further comprises a conductive interface extending over the first conductive element within the opening.

According to one embodiment, the first conductive element comprises a recess.

According to one embodiment, the first and second conductive elements are covered on their sidewalls and bottoms by diffusion barriers.

Embodiments of the disclosure also relate to a device comprising an integrated circuit according to one of embodiments disclosed above.

BRIEF DESCRIPTION OF THE SEVERAL VIEWS OF THE DRAWINGS

Embodiments of the present disclosure will now be described in connection with, but not limited to, the appended drawings in which.

DETAILED DESCRIPTION

FIGS. 2A to 2K are cross-sectional views of an integrated circuit showing different steps of fabricating an interconnection structure 12 according to the disclosure. It is to be noted that one or more elements in these drawings may be illustrated not-to-scale, for illustrative clarity, in particular as far as the thicknesses are concerned.

Figure 2A:
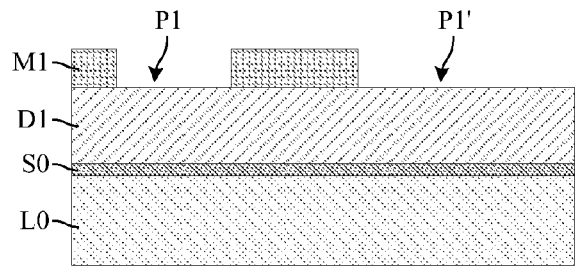
FIGS. 2A to 2K show steps of fabricating an interconnection structure according to one embodiment of the disclosure.

In FIG. 2A, the integrated circuit comprises, from bottom to top, a base L0, an etch stop layer S0, a dielectric layer D1, and a mask layer M1. The base L0 is schematically represented and may comprise a pre-metal dielectric (PMD) and interconnections, such as Tungsten plugs, to an underlying circuit comprising transistor elements (not shown) fabricated on a silicon substrate during precedent processing steps.

At the step shown in FIG. 2A, two patterned openings P1, P1' are made in the mask layer M1. The patterning of the openings P1, P1' has been done for example by means of conventional photolithography.

Figure 2B:
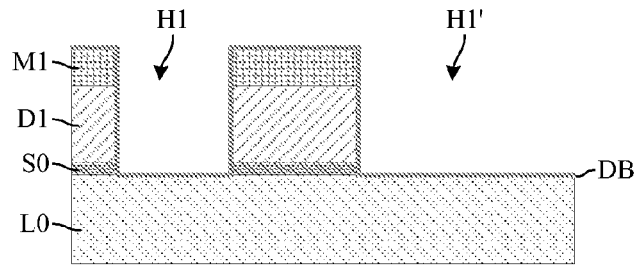

During steps shown in FIG. 2B, two trenches H1, H1' are etched in the dielectric D1 in the region underlying the patterned openings P1, P1'. The etch step is performed for a certain amount of time for example using an anisotropic etch process.

A diffusion barrier DB is then deposited on the bottoms and sidewalls of trenches H1, H1' to prevent diffusion of conductive material. The diffusion barrier may be deposited by means of Physical Vapor Deposition (PVD), and may be tantalum nitride TaN, which is known to have an excellent barrier performance against the diffusion of copper and is relatively easily integrated in existing semiconductor processing methods. An adhesion layer (not shown) may be deposited on the diffusion barrier DB to aid in the deposition of a seed layer of conductive material.

Figure 2C:
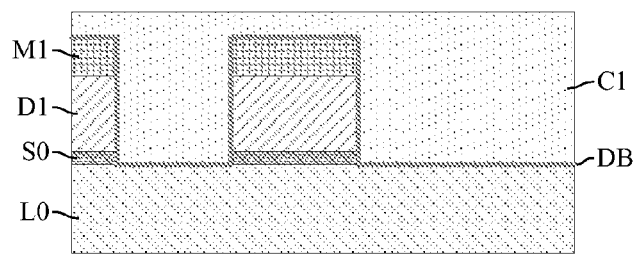

During a step shown in FIG. 2C, a first conductive material C1 is deposited over the diffusion barrier DB. The material C1 fills the trenches H1, H1' and extends over the mask layer M1. The conductive material C1 may be deposited by first depositing a "seed layer" (not shown) of a conductive material, and then depositing conductive material on the seed layer by means of electroplating.

Figure 2D:
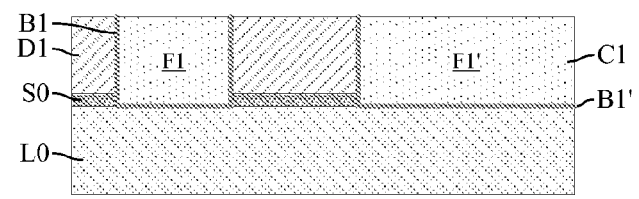

During a step shown in FIG. 2D, the conductive material C1, diffusion barrier DB, and mask layer M1 are removed to a certain depth, such as by means of chemical-mechanical polishing ("CMP"). As a result, two conductive lines F1, F1' are formed in the dielectric layer D1, the bottoms and sidewalls of lines F1, F1' being surrounded by diffusion barriers B1, B1', derived from the initial diffusion barrier DB. Line F1 is shown in lateral cross-section, and line F1' is shown in longitudinal cross-section.

Figure 2E:
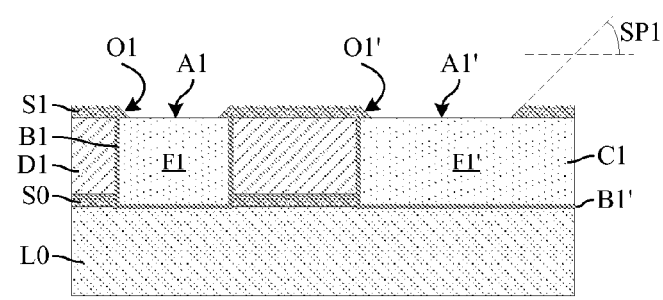

During steps shown in FIG. 2E, a first etch stop layer S1 is deposited over the top surface of the integrated circuit. The stop layer S1 thus covers the conductive lines F1, F1' and the dielectric layer D1. Openings O1, O1' are then made in the etch stop layer S1 over lines F1, F1' to form connection areas A1, A1'. In the example shown, the openings each present a slope SP1 of about 45°. The degree of the slope may be adjusted depending upon the etch process used to form the openings. The sizes and slopes of openings O1, O1' may vary, and will be described in further detail later. The stop layer S1 may additionally prevent diffusion of the conductive material C1.

Figure 2F:
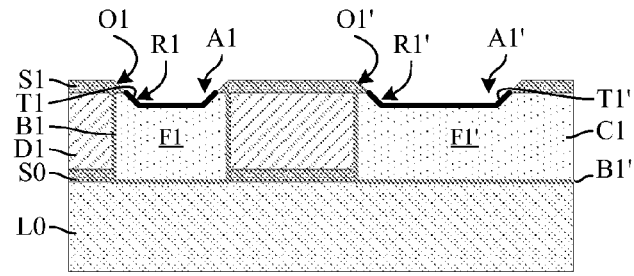

During steps shown in FIG. 2F, recesses R1, R1' are etched in the top surfaces of conductive lines F1, F1', in the connection areas A1, A1'. The sizes of the recesses and the slopes of their sidewalls are determined by the sizes and slopes of the openings O1, O1' in the first etch stop layer S1.

Conductive interfaces T1, T1' are then formed in the recesses R1, R1' in the connection areas A1, A1'. These interfaces aid electrical contact, and may optionally also prevent diffusion of the conductive material C1. Preferably, this conductive interface material has a high resistance to electromigration.

The interfaces T1, T1' may be deposited by a self-aligned barrier process ("SAB"). For such processes, a conductive interface material having a high selectivity for the conductive material C1 of lines F1, F1' is deposited over the entire structure. This material reacts only or principally with the conductive material C1 in the connection areas A1, A1'. The deposition and patterning of the first etch stop layer S1 before the deposition of interfaces T1, T1' further provides that there is no conductive interface residue (metallic deposition) on the dielectric layer D1, as the dielectric layer is covered by the first etch stop layer. As a result, line-to-line current leakage is reduced. A cleaning step may then be performed to remove any conductive interface residue on the stop layer S1.

Figure 2G:
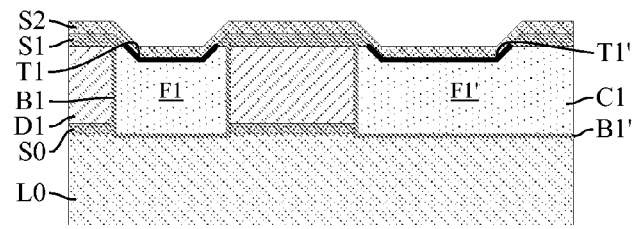

During a step shown in FIG. 2G, a second etch stop layer S2 is deposited on the etch stop layer S1 and the conductive interfaces T1, T1' in the connection areas A1, A1' covering the conductive lines F1, F1'. The second etch stop layer S2 may be of the same material as the first etch stop layer S1 in one embodiment, or the second etch stop layer S2 may be of a material that is selectively etchable with respect to the first etch stop layer S1 in another embodiment. This second etch stop layer may also prevent diffusion of the conductive material C1 upwards from the conductive lines F1, F1'.

Figure 2H:
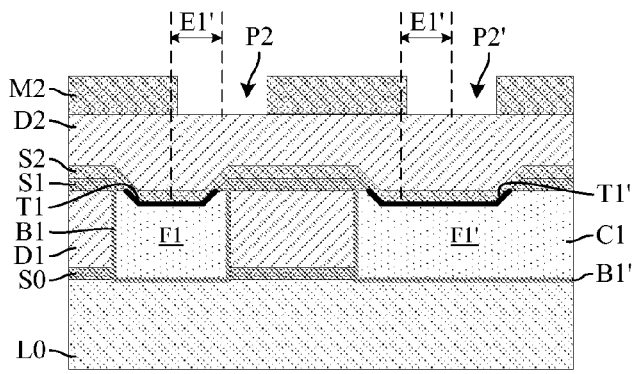

During steps shown in FIG. 2H, a dielectric layer D2 is deposited on the second etch stop layer S2, and then a mask layer M2 is deposited on the dielectric D2. Two patterned openings P2, P2' are then made in the mask layer M2. The openings P2, P2' have a misalignment error E1' with respect to lines F1, F1' (shown from center of desired location to center of actual location). This misalignment error may arise during the photolithographic patterning of the areas P2, P2'.

Figure 2I:
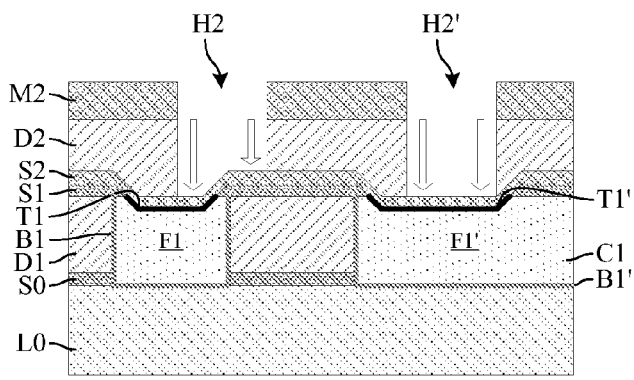

During a step shown in FIG. 2I, the dielectric D2 is etched to form holes H2, H2'. The etch process stops when the second etch stop layer S2 is reached, due to the selectivity of the etch reagent for the dielectric D2 with respect to the second etch stop layer S2.

Figure 1A:
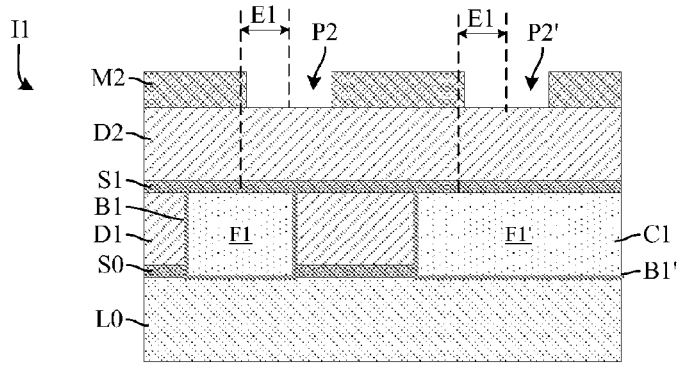
FIGS. 1A to 1C show steps of fabricating a conventional interconnection structure in an integrated circuit.
Figure 1B:
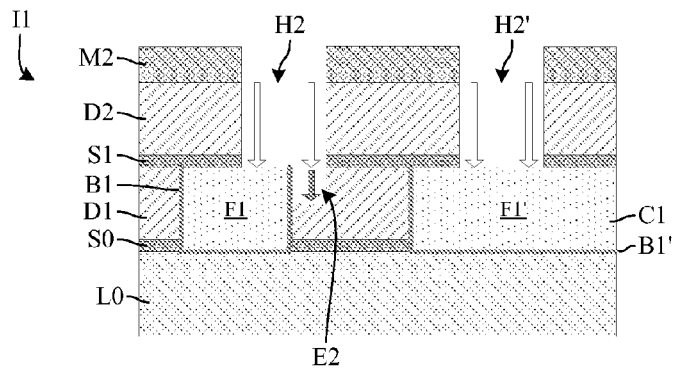
Figure 1C:
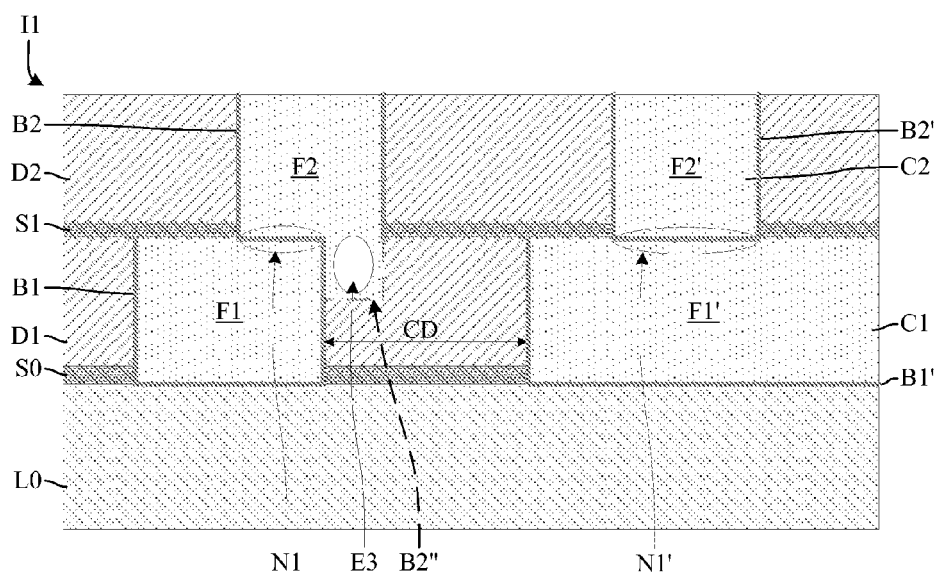
Figure 2J:
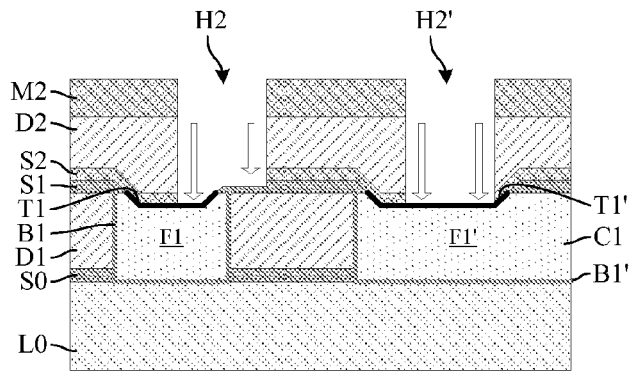

During steps shown in FIG. 2J, the second etch stop layer S2 is etched and removed at the bottom of the holes H2, H2', due to the selectivity of the etch reagent for stop layer S2 with respect to stop layer S1, allowing stop layer S2 to be etched despite any differences in depth. A short overetch step is then performed upon the conductive interfaces T1, T1'. During the overetch step, the first etch stop layer S1 in the misaligned area over the dielectric layer D1 is also subjected to the etch chemical reagents. The first etch stop layer S1 may be slightly etched, but protects the underlying dielectric layer D1 from being etched, so that no lateral etch region E2 such as shown in FIG. 1B is created.

Figure 2K:
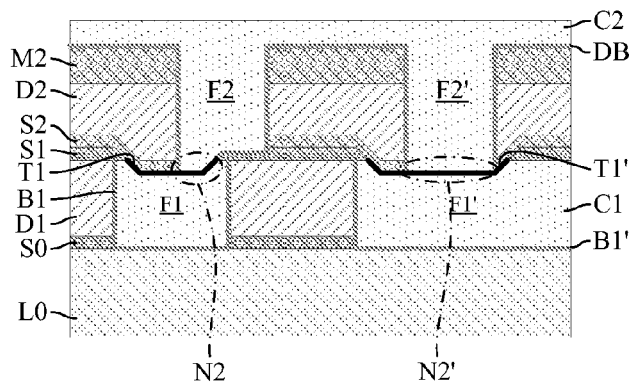

During steps shown in FIG. 2K, a diffusion barrier DB is deposited on the bottoms and sidewalls of the holes H2, H2'. A second conductive material C2 is then deposited in the holes H2, H2'. The conductive material C2, diffusion barrier DB, and mask layer M2 are then removed to a certain depth, such as by chemical-mechanical polishing. As a result, two conductive vias F2, F2' are formed in the dielectric layer D2. The bottoms and sidewalls of the conductive vias F2, F2' are surrounded by diffusion barriers B2, B2', derived from the initial diffusion barrier DB.

Figure 3:
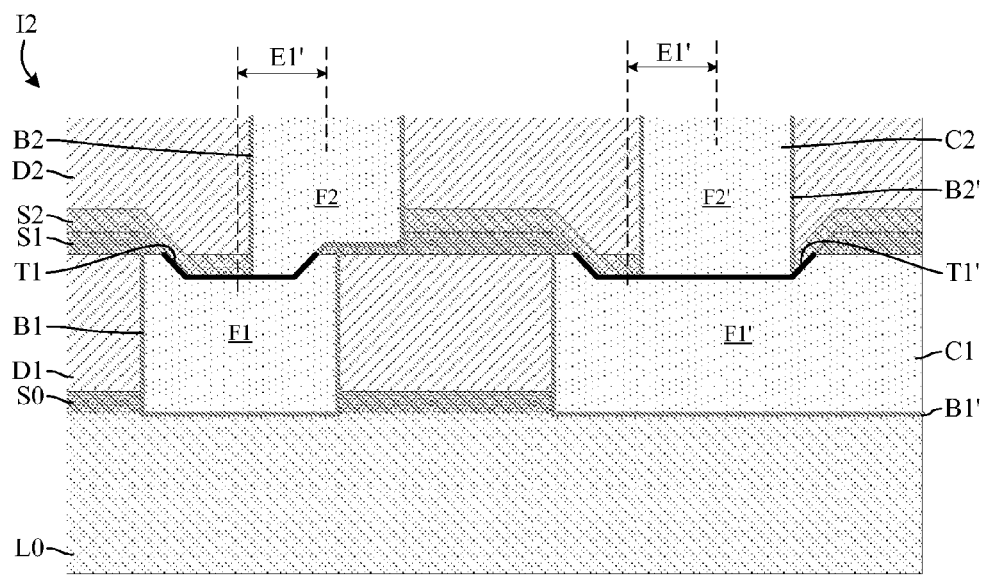
FIG. 3 shows an interconnection structure fabricated according to the method shown in FIGS. 2A to 2K, FIGS. 4A, 4B show alternatives of an interconnection structure according to embodiments of the disclosure.

FIG. 3 shows a cross-sectional view of the interconnection structure 12 obtained with the above-described method. The interconnection structure 12 comprises, from bottom to top: the base L0; conductive lines F1, F1' embedded in the first dielectric layer D1 and covered on their bottoms and sidewalls by diffusion barriers B1, B1'; and conductive vias F2, F2' embedded in the second dielectric layer D2, covered on their bottoms and sidewalls by the diffusion barriers B2, B2', and in electrical contact with the lines F1, F1' at contacts N2, N2'.

It can be seen that despite the alignment error E1' of the conductive vias, the dielectric layer D1 does not present a lateral etch region, as noted above. Consequently, the diffusion barrier B2 prevents diffusion of the conductive material and the conductive material is well-filled in conductive via F2.

Furthermore, the effects of electromigration are delayed, that is to say, there are fewer "early fails" of the integrated circuit. This is due to the conductive interfaces T1, T1' between conductive line F1 and conductive via F2. The conductive interfaces have areas larger than the vias F2, F2' and present a greater resistance to the formation of holes due to electromigration at the contacts N2, N2' between the lines and vias.

The conductive via F2 is therefore in electrical contact with the first conductive element F1 in a first region of the connection area A1, and in horizontal contact with the first etch stop layer S1 in a region outside the connection area A1 (that is, a bottom surface of the conductive via F2 horizontally contacts a top surface of the first etch stop layer S1).

Figure 4A:
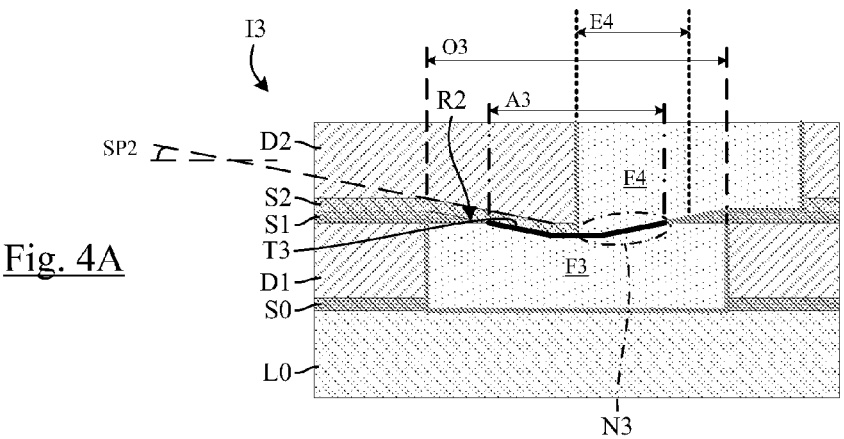

FIG. 4A shows a first variant of an interconnection structure 13 according to the disclosure. Similarly to interconnection structure 12, interconnection structure 13 comprises the base L0, the etch stop layer S0, a conductive line F3 embedded in the dielectric layer D1 and surrounded by a diffusion barrier, and a conductive via F4 embedded in the dielectric layer D2, surrounded by a diffusion barrier, and in electrical contact at contact N3 with line F3. An opening O3 has been formed in the first etch stop layer S1, with a slope SP2 less than slope SP1, for example 30°, to form a connection area A3 covered by a conductive interface T3.

Figure 4B:
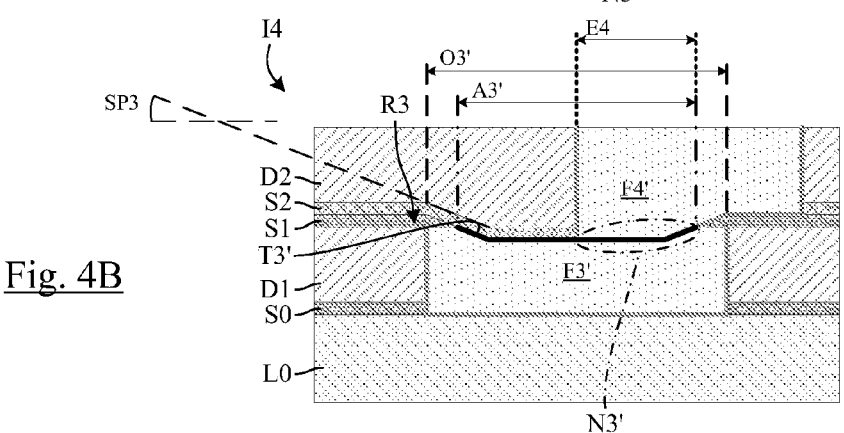

FIG. 4B shows a second variant of an interconnection structure 14 according to the disclosure. Similarly to interconnection structure 13, interconnection structure 14 comprises the base L0, the etch stop layer S0, a conductive line F3' embedded in the dielectric layer D1 and surrounded by a diffusion barrier, and a conductive via F4' embedded in the dielectric layer D2, surrounded by a diffusion barrier, and in electrical contact at contact N3' with line F3'. An opening O3' has been formed in the first etch stop layer S1, with a slope SP3 greater than slope SP1, for example 60°, to form a connection area A3' covered by a conductive interface T3'.

In FIGS. 4A and 4B, the openings O3, O3' are shown as being approximately equal to the widths of the conductive lines F3, F3', which are assumed to be at the minimum size possible. It can be seen that for the same opening size, the smaller slope SP2 yields a smaller connection area A3, whereas the greater slope SP3 yields a larger connection area A3'.

For a same misalignment error E4 (shown from center of desired location to center of actual location), the smaller slope SP2 yields a smaller contact N3 between the conductive line F3 and via F4, whereas the greater slope SP3 yields a larger contact N3' between the conductive line F3' and via F4'.

It will be understood by the skilled person that the size of the opening and the amount of slope may be adjusted depending on factors such as the feature size, desired connection area size, desired contact size, expected maximum misalignment, etc. For instance, a great slope or a large opening may be used so as to form a connection area extending over all or almost all of the top surface of the conductive lines.

In determining the optimum parameters of the size and slope of the opening for a given process, the following should also be taken into consideration:

a smaller slope (SP2) renders the first etch stop layer S1 more sensitive to breakthrough during etching as it is thinner towards the center of the opening. This is shown in FIG. 4A as region R2. In this case, the first etch stop layer may be removed during the etching of the second etch stop layer or the overetch step, leaving the conductive line underneath exposed to the chemical reagent.

a greater slope (SP3) renders the first etch stop layer S1 more sensitive to misalignment when the opening O3' is made. A misalignment at this stage may cause the dielectric layer D1 not to be entirely covered by the first etch stop layer. This is shown in FIG. 4B as region R3. If the opening O3' is largely misaligned, the first etch stop layer S1 will not extend over the top edges of the conductive line. Dielectric layer D1 is then covered only by the second etch stop layer S2 near the conductive line F3. When the second etch stop layer S2 is etched, the etch chemical reagents will reach the dielectric material, possibly causing a lateral etch region.

Therefore, the two-dimensional size of the connection area may vary depending upon various factors, such as the width and orientation of the underlying conductive line (or via). By "connection area" it should therefore be taken to mean an area formed in the stop layer S1 in an opening above the conductive feature(s) before the holes in the second dielectric material D2 are etched.

It should be noted that if the second etch stop layer S2 is an inter-metal dielectric material, such as SiCN, "upward" diffusion of the underlying conductive material C1 of the conductive lines is prevented. Therefore, during etching, the second etch stop layer S2 is only traversed in the areas intended to form the conductive vias, so the rest of the top surfaces of the conductive lines remain covered by this second etch stop layer, which prevents diffusion of the conductive material.

It should also be noted that the recesses in the conductive lines may be omitted. For example, their presence and/or depth may depend upon the overlying via etch process. It may be desired for example to have a larger contact between a line and a via, in which case the recess may be made deeper. If there is no recess, the contact is smaller, and the resistance is increased.

Figure 5:
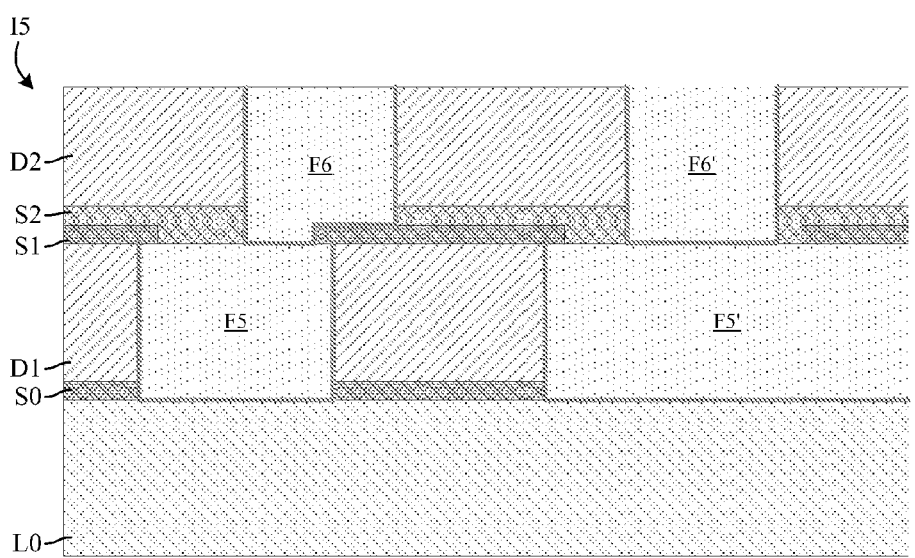
FIG. 5 shows another interconnection structure according to an embodiment of the disclosure.

These variations are illustrated in FIG. 5, which shows a cross-sectional view of a fourth interconnection structure 15 according to the disclosure. The interconnection structure 15 comprises, from bottom to top, the base L0, two conductive lines F5, F5' embedded in a dielectric layer D1 and covered on their bottoms and sidewalls by diffusion barriers, and two conductive vias F6, F6' embedded in a second dielectric layer D2 and covered on their bottoms and sidewalls by diffusion barriers.

The openings that have been made in the first etch stop layer have here perpendicular slopes. No recesses have been made in conductive lines F5, F5', and no diffusion barriers have been formed in the openings since the second etch stop layer S2 is sufficient to prevent diffusion of the conductive material of lines F5, F5'. The second etch stop layer S2 is planar on its top surface, and does not follow the topography of the underlying first etch stop layer S1.

Figure 6:
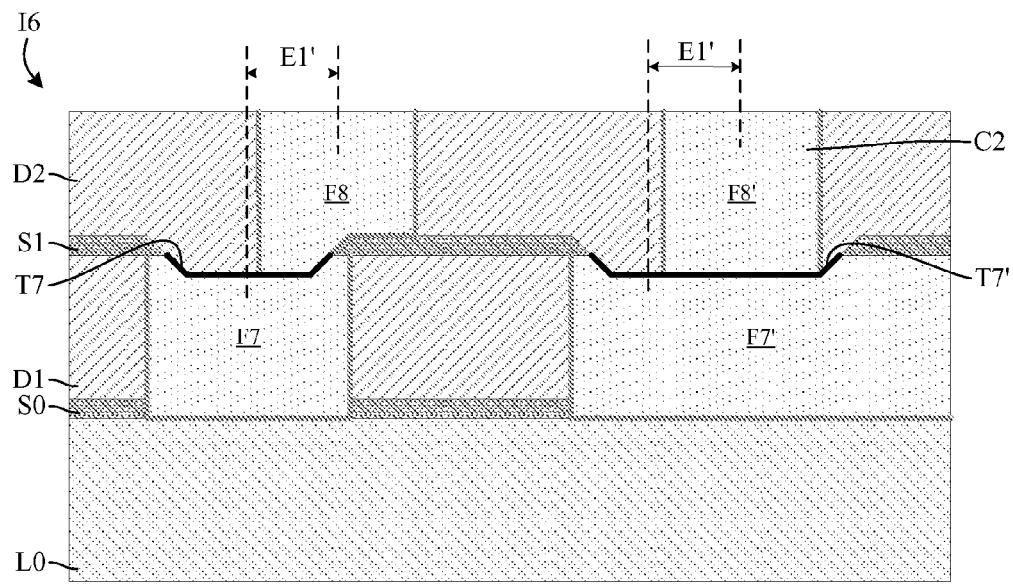
FIG. 6 shows another interconnection structure according to an embodiment of the disclosure.

FIG. 6 shows a cross-sectional view of a fifth interconnection structure 16 according to the disclosure. In this variant, the conductive interfaces formed in the openings of the first etch stop layer (connection areas) are sufficient by themselves to prevent diffusion of the conductive material C1 upwards from the conductive lines and the second etch stop layer S2 may thus be omitted. FIG. 6 therefore shows, from bottom to top, the base L0, two conductive lines F7, F7' embedded in a dielectric layer D1 and covered on their bottoms and sidewalls by diffusion barriers, and two conductive vias F8, F8' embedded in a second dielectric layer D2 and covered on their bottoms and sidewalls by diffusion barriers. The first etch stop layer S1 is deposited over the conductive lines F7, F7' and the dielectric layer D1. Openings are then made in the first etch stop layer in the connection areas. Conductive interfaces T7, T7' are deposited in the connection areas, then a dielectric layer D2 is deposited on top of the first etch stop layer S1' and the conductive interfaces T7, T7' in the openings of the etch stop layer. Then, holes are etched in the dielectric layer D2 until the connection areas are reached. In the case of misalignment, the holes will reach the first etch stop layer and stop thereon. No etching step of the first etch stop layer is then performed. The conductive vias F8, F8' are then formed as previously-described to form an interconnection structure.

Alternatively, the conductive material used for the conductive lines and vias may not require diffusion barriers on the bottom, sidewalls, and/or tops of the lines and vias. In this case the diffusion barriers may be omitted, and the second etch stop layer may or may not be present.

Figure 7:
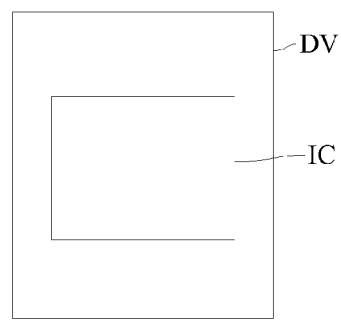
FIG. 7 shows a device comprising an integrated circuit according to an embodiment of the disclosure.

As shown in FIG. 7, embodiments of the disclosure also relate to a device DV comprising an integrated circuit IC fabricated according to one of the methods described above. Such a device may be a microprocessor, a portable object, an electronic tag, etc.

It should further be noted that while a method of forming a single conductive feature, for example the conductive vias, at a time (the "damascene" method) has been shown in the figures, the method according to the disclosure is equally applicable to other methods of forming conductive features, in particular to a "dual damascene" method wherein conductive lines and vias are formed at once.

It should further be noted that the self-aligned barrier approach is not the only way to form the diffusion barriers on the tops of the conductive lines. Other conductive line covering methods may be used, such as a copper surface modification approach known as copper silicon nitride CuSixNy, wherein the copper material of the feature reacts with silicon and nitride reactants.

It should further be noted that if the first etch stop layer and the second etch stop layer are of different materials, it may be envisaged to select them as a function of the etch selectivities. For example, it may be desired to have a first etch stop layer that takes a longer time (i.e., is more difficult to etch) than the second etch stop layer. In this manner, while the overetch step of the conductive lines is being performed, the first etch stop layer resists the etch process. Alternatively, they may be chosen so that the etch chemical reagent of the second etch stop layer is ineffective on the first etch stop layer. In this manner, the etch breaks through the second etch stop layer above the conductive lines, but does not diminish nor break through the first etch stop layer, which is only in the areas where it is not desired to etch (that is, over the dielectric layer). Finally, the thicknesses of the etch stop layers may be varied. For example, the first etch stop layer may be thicker than the second etch stop layer, so that it takes longer to etch during the overetch step performed above the conductive lines.

In some embodiments, the dielectric materials used for the dielectric layers may comprise a silicon oxide based dielectric, such as silicon oxycarbide SiOC or may be for example silicon dioxide $SiO_2$, a low-k dielectric layer such as organo-silicate glass OSG, polyarene ether (SiLK), etc. The thickness of the dielectric layers may be 300 nm or more.

The etch stop layers may be for example silicon nitride SiN, silicon carbide SiC, silicon carboxide SiCO, and silicon carbonide SiCN and have a thickness between about 5 to 20 nm.

The conductive interfaces T1, T1', T3, T3', T7, T7' may have a thickness between about 5 to 30 nm. Such interface materials may be applied by well known techniques such as plasma enhanced physical vapor deposition (PECVD), atomic layer deposition (ALD), chemical vapor deposition (CVD), sputtering, evaporation, or electroplating techniques. The conductive interfaces may be for example cobalt tungsten phosphorous CoWP deposited using the self-aligned barrier process, or cobalt Co deposited using chemical vapor deposition.

The conductive material used to form the conductive lines or vias may be aluminum, aluminum alloys, copper, copper alloys, tantalum, tungsten, titanium or other metal typically employed in the formation of microelectronic devices. The metal may be applied by such techniques as vapor deposition, sputtering, evaporation and the like.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of fabricating an interconnection structure of an integrated circuit, comprising:
    forming a first conductive element within a first dielectric layer;
    depositing a first etch stop layer above the first conductive element and the first dielectric layer;
    exposing a first connection surface of the first conductive element by forming an opening in the first etch stop layer;
    after forming the opening in the first etch stop layer, depositing a second dielectric layer above the etch stop layer and directly on the first connection surface of the first conductive element;
    forming a hole in the second dielectric layer by etching the second dielectric layer, the hole exposing at least a portion of the first connection surface and a portion of the first etch stop layer; and
    forming a second conductive element by filling the hole with a conductive material, the second conductive element being in electrical contact with the first conductive element and the first etch stop layer.

2. A method according to claim 1, further comprising:
    depositing a second etch stop layer above the first etch stop layer and in the opening above the first conductive element in the first connection surface, wherein depositing the second dielectric layer includes depositing the second dielectric layer above the second etch stop layer; and
    etching the second etch stop layer at a bottom of the hole formed in the second dielectric layer.

3. A method according to claim 1, further comprising, after forming the opening in the first etch stop layer above the first conductive element, forming a conductive interface over the first conductive element, and wherein exposing the first connection surface of the first conductive element includes exposing the conductive interface as the first connection surface.

4. A method according to claim 3, wherein the conductive interface is formed by selective deposition.

5. A method according to claim 1, wherein forming the opening in the first etch stop layer above the first conductive element comprises forming a recess in the first conductive element.

6. A method according to claim 5, further comprising, after forming the recess in the first conductive element, forming a conductive interface in the recess, wherein the conductive interface is first connection surface.

7. A method according to claim 6, further comprising;
    depositing a second etch stop layer above the first etch stop layer and in the recess in the first conductive element, wherein depositing the second dielectric layer includes depositing the second dielectric layer above the second etch stop layer; and
    etching the second etch stop layer at a bottom of the hole formed in the second dielectric layer before forming the second conductive element in electrical contact with the first conductive element via the conductive interface.

8. A method according to claim 1, comprising forming diffusion barriers around the first and second conductive elements.

9. A method according to claim 8, wherein:
    the first and second etch stop layers are chosen from the group consisting of silicon nitride, silicon carbide, silicon carboxide, and silicon carbonide;
    the diffusion barriers are chosen from the group consisting of titanium, titanium nitride, tantalum, and tungsten nitride;
    the conductive interfaces are chosen from the group consisting of cobalt tungsten boron and cobalt;
    the first and second conductive materials are chosen from the group consisting of aluminum, aluminum alloys, copper, copper alloys, tantalum, tungsten, and titanium; and
    the first and second dielectric materials are chosen from the group consisting of silicon oxycarbide, silicon dioxide, a low-k dielectric, organo-silicate glass, and polyarene ether.

* * * * *